United States Patent [19]

Watanabe et al.

[11] Patent Number: 4,999,083
[45] Date of Patent: Mar. 12, 1991

[54] METHOD OF ETCHING CRYSTALLINE MATERIAL WITH ETCHANT INJECTION INLET

[75] Inventors: Nobuo Watanabe; Takeo Tsukamoto, both of Atsugi; Toshihiko Takeda, Tokyo; Haruhito Ono, Ashigara; Masahiko Okunuki, Itsukaichi, all of Japan

[73] Assignee: Canon Kabushiki Kaisha, Tokyo, Japan

[21] Appl. No.: 415,766

[22] Filed: Oct. 2, 1989

[30] Foreign Application Priority Data

Oct. 2, 1988 [JP] Japan .................................. 63-247817
Sep. 29, 1989 [JP] Japan .................................. 1-255504

[51] Int. Cl.⁵ .......................................... H01L 21/306
[52] U.S. Cl. ...................................... 156/628; 156/643
[58] Field of Search ................ 156/628, 643, 647, 651

[56] References Cited

U.S. PATENT DOCUMENTS

| 4,264,382 | 4/1981 | Anantha et al. | 156/643 |
| 4,450,041 | 5/1984 | Aklufi | 156/628 |
| 4,523,971 | 6/1985 | Cuomo et al. | 156/643 |
| 4,725,332 | 2/1988 | Spohr | 156/643 |

FOREIGN PATENT DOCUMENTS

| 0148448 | 7/1985 | European Pat. Off. . | |
| 0223694 | 5/1987 | European Pat. Off. . | |
| 2334199 | 7/1977 | France . | |
| 238468 | 6/1985 | German Democratic Rep. . | |
| 49-31716 | 3/1974 | Japan . | |
| 49-91189 | 8/1974 | Japan . | |
| 53-138286 | 12/1978 | Japan | 156/643 |
| 56-21331 | 2/1981 | Japan | 156/643 |
| 63-141316 | 6/1988 | Japan . | |
| 1551290 | 8/1979 | United Kingdom . | |

OTHER PUBLICATIONS

Ashby, Doping Level Selective Photochemical Dry Etching of GaAs, Appl. Phys. Lett. 46(8), Apr. 15, 1985, pp. 752-754.

Parry, Localized Substrate Heating During Ion Implantation, Jan./Feb. 1978, J. Vac. Sci. Tech., 15(1), pp. 111-115.

Wang, A Mass-Separating Focused-Ion-Beam System for Maskless Ion Implantation, Nov./Dec. 1981, J. Vac. Sci. Tech, 19(4), pp. 1158-1163.

J. I. Pankove et al., "Bombardment-Induced Corrosion Resistance of Aluminum", Applied Physics Letters, vol. 39, No. 1, Jul. 1, 1981, pp. 119-121, American Institute of Physics, New York.

K. Gamo et al., "Characteristics of Al Maskless Patterning Using Focused Ion Beams", Nuclear Instruments and Methods in Physics Research, Section B7/8, No. 1, Part II, Mar. 1985, pp. 864-868, Elsevier Science Publishers B.V. (North Holland Physics Publishing Division), Amsterdam, NL.

Primary Examiner—David L. Lacey
Assistant Examiner—John J. Bruckner
Attorney, Agent, or Firm—Fitzpatrick, Cella, Harper & Scinto

[57] ABSTRACT

A fine working method of a crystalline material comprises forming an ion injection region in a crystalline material by irradiating a focused ion beam on a crystalline material and subsequently removing a predetermined region of the ion injection region by applying a chemical etching treatment. The method includes performing ion injection where no removal of the predetermined region occurs even if the crystalline material is exposed to an etchant. The predetermined region is removed by injecting an etchant into the ion injection region.

4 Claims, 8 Drawing Sheets

METHOD OF ETCHING CRYSTALLINE MATERIAL WITH ETCHANT INJECTION INLET

BACKGROUND OF THE INVENTION

1. Field of the Invention

This invention relates to a fine working method of a crystalline material. Particularly, the present invention relates to a fine working method of a crystalline material which performs etching working by use of a focused ion beam as a part of the working steps.

2. Related Background Art

In the prior art, as the fine working method by use of etching of a crystalline material such as bulk or thin film single crystalline materials, etc., there have been generally employed the method in which a resist, etc. is coated on its worked surface, a desired resist pattern is formed by lithography and then the portion without such resist pattern is removed chemically or physically.

However, in the above working method, for fine etching working with a line width of 1 micron or less, etching with high precision can be effected with difficulty, with resolution of the resist and expansion of the working region during etching presenting obstacles.

Also, according to the etching method as described above, working of a crystalline material into a cross-sectional shape having a region of reverse tapered shape or hollow shape could be done with extreme difficulty for the following reasons.

In the prior art, when working into a reverse tapered shape or a tunnel shape, anisotropic working has been practiced. Such anisotropic working utilizes the fact that etching speed is remarkably different depending on the crystal orientation. Accordingly, the crystal orientation of a crystalline material must be matched previously to a shape desired to be worked, and therefore this method could be applied only to a single crystalline material with limited orientation. Additionally, it could not be applied to those with different crystal orientations within the same plane such as a polycrystalline material. Further, when working in shape of a tunnel is to be performed, a bore must be opened at the side surface of the sample and the bore must be excavated by etching.

On the other hand, other than the fine working method according to lithography by use of a resist, there is also the method by use of focused ion beam. For example, J. Vac. Sci. Tehnol. B, Vol. 6, No. 3, p. 1014–1017, May/Jun 1988 "Fabrication of one-dimensional GaAs wires by focused ion beam implantation" shows fine working with a line width of 1 micron or less. Also, here is shown an example, in which etching is effected by use of HCl after injection of focused ion beam injection of Si ions onto a GaAs substrate. However, also nothing is shown here about application to a complicated working such as hollow shape onto a crystalline material.

SUMMARY OF THE INVENTION

The present invention has been accomplished in view of the various points as described above, and its object is to provide a fine working method of a crystalline material which cancels the problems of the prior art.

The present invention is particularly intended to provide a fine working method which can work a crystalline material into a complicated shape having a cross-section of reverse tapered shape or hollow shape which has been worked with difficulty in the prior art.

Another object of the present invention is to provide a fine working method of a crystalline material capable of forming any desired three-dimensional structure by applying an etching treatment on the region where ion injection is effected overlappingly.

Still another object of the present invention is to provide a fine working method of a crystalline material, which comprises forming an ion injection region in a crystalline material by irradiating a focused ion beam on a crystalline material and subsequently removing a predetermined region of said ion injection region by applying a chemical etching treatment, said method having the steps of:

performing ion injection under the ion injecting conditions where no removal of said predetermined regions occurs even if the crystalline material may be exposed to an etchant, and removing the predetermined region of said ion injection region by injecting an etchant into the ion injection region formed by ion injection under said ion injecting conditions.

DESCRIPTION OF THE PREFERRED EMBODIMENTS

Figure 1A:
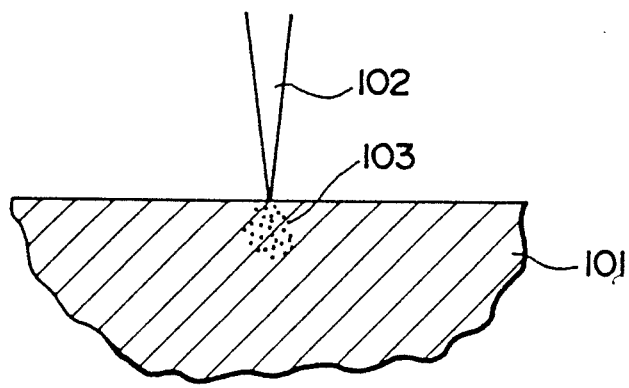
FIGS. 1A and 1B are schematic sectional views showing an example when an etching treatment is applied after one line ion injection by use of a focused ion beam scanning device.

Preferable of the fine working method of a crystalline material of the present invention is the fine working method of a crystalline material which comprises forming an ion injection region in a crystalline material by irradiating a focused ion beam at a predetermined region of crystalline material and subsequently removing a predetermined region of said ion injection region by applying a chemical etching treatment, said method having the steps of:

performing ion injection under the ion injecting conditions where no removal of said predetermined regions occurs even if the crystalline material may be expose to an etchant, and removing the predetermined region of said ion injection region by injecting an etchant into the ion injection region formed by ion injection under said ion injecting conditions.

Also preferable is the fine working method of a crystalline material by forming an ion injeCtion region in the crystalline material by irradiating a focused ion beam at a predetermined position of the crystalline material, and subsequently applying a chemical treatment to remove the predetermined region of said ion injection region, wherein ions are injected overlappingly by changing the ion injecting conditions during irradiation of said focused ion beam.

By practicing the present invention, a crystalline material can be worked to a complicated shape having a cross-sectional shape of reverse tapered shape or hollow shape which has been worked with difficulty in the prior art.

Also, by applying etching treatment overlappingly on the region where ions have been injected, any desired three-dimensional shape can be formed.

As a result, it has become possible to increase the integration degree of electronic device, whereby a fine micromechanics device utilizing mechanical action or a quantum effect device having an extremely fine structure can be obtained.

As the working of micromechanics device for which the present invention can be used, for example, there may be included working of cantilever of accelerating sensor, working of pressure sensor utilizing internal and external pressure difference of hollow groove, etc.

As the working of quantum effect device, for example, by use of an electroconductive crystalline material, an electroconductive fine wire structure can be obtained by applying the working of forming a hollow portion in said electroconductive crystalline material and the etching removal working of the portion adjacent to said hollow portion. Further, by making the fine wire about 100 nm or less, it is applicable to a quantum effect device capable of observing the interference effect by the progressive electron wave effect or the fluctuation phenomenon.

The present invention is described in detail by referring to the drawings.

Figure 2:
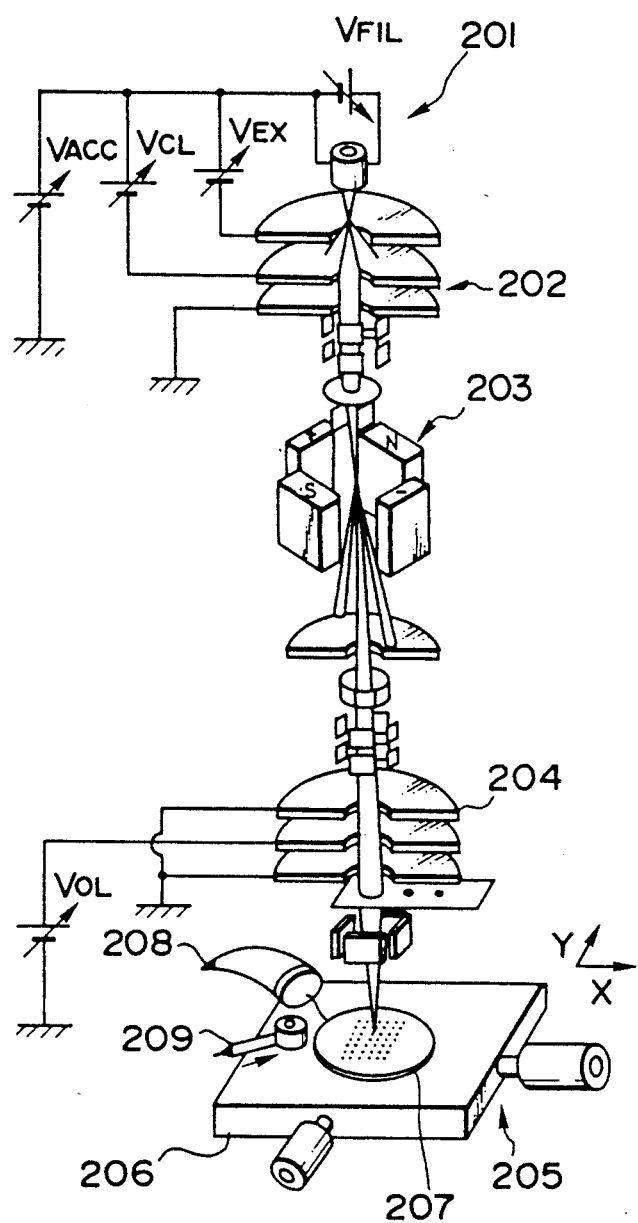
FIG. 2 is a schematic constitutional illustration showing an example of the focused ion beam scanning device to be used for practicing the present invention

FIG. 2 is a schematic illustration showing schematically the focused ion beam scanning device in embodying the fine working method of a crystalline material of the present invention. The ion beam released by electrical field from an ion source 201 (e.g. Au-Si-Be liquid metal) is focused by an electronic condenser lens 202, and only necessary ion species are separated by an EB mass separator 203. Then, the ion beam is again focused by an objective lens and the ion beam is deflected by computer control to be irradiated on the target 207. The target 207 is moved freely within the XY plane by a moving means having a stage 206 equipped at a freely movable staging device 205 to be set at a desired position. In FIG. 2, 208 is SEI (secondary electron imager) and 209 is Faraday Cup for measuring the current value of the ion beam.

As the ion injecting conditions when the device of FIG. 2 is used, Be, Si, B, As, Ni, Pd, Ga, H, He, etc. can be employed as the injected ions by changing the ion source 201.

As the acceleration voltage of ions, 20 KV to 200 KV may be employed, and as the beam diameter of the ion beam. Preferably 0.05 $\mu$m to 1 $\mu$m may be suitably employed.

As the crystalline material which can be used as the target, in addition to Si crystal, Ge crystal, for example, any crystalline material such as yttruim-aluminum-garnet (YAG), yttrium-iron-garnet (YIG), etc. epitaxially grown on a substrate can be used, and other than single crystal materials, polycrystalline materials are also available. This is because, in the present invention the crystalline structure in the injection region is destroyed by injection of focused ion beam to become an amorphous structure and selective etching is effected by utilizing the difference in etching speed between the crystalline region and the amorphous region.

Here, specific examples of the working conditions are to be described.

By use of a target sample having yttrium-iron-garnet (YIG) epitaxially grown in liquid phase to a thickness of 4 $\mu$m on a gadlinium gallium-garnet (GGG) (111) substrate, and by use of Au-Si-Be liquid metal as the ion source 201, Si or Be ions are irradiated vertically on the sample surface with an acceleration voltage of 40 to 80 KV and a beam diameter of 0.1 $\mu$m. The thin layer YIG used here is a magnetic garnet which is useful for Bloch line memory, optical eye relator, etc. Etching can be performed in the case of the above conditions by, for example, dipping a sample injected with ions in phosphoric acid at room temperature. Specifically, it may be also dipped in, for example 85% phosphoric acid solution for about 5 hours, but the etching time can be shortened by dipping in phosphoric acid solution by applying ultrasonic by means of an ultrasonic cleaner.

The etchant is related to the substrate material, injected ions, the ion injecting conditions, and may be suitably selected from those with great selectivity in etching between the ion injected region which has been changed to amorphous non-injected crystalline region.

Figure 1B:
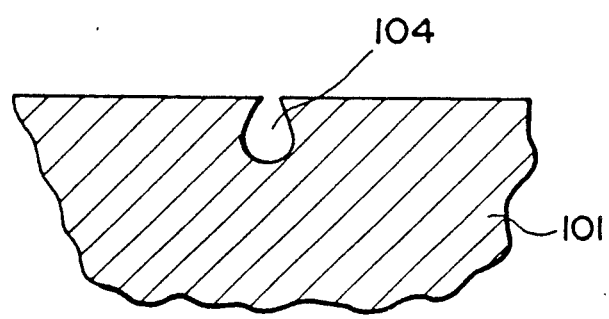

FIGS. 1A and 1B show cross-section of an example of sample which is etched by dipping in a 85% phosphoric acid solution while applying ultrasonic after one line irradiation of YIG layer 101 with an ion beam 102 of $Be^{2+}$ at an injection amount of $2 \times 10^{16}$ ions/cm$^2$ with accelerated energy of 160 keV focused to 0.1 $\mu$m$\phi$. FIG. 1A shows the ion injected state, and FIG. 1B the state after etching. According to the examples in FIGS. 1A and 1B, only the ion injected portion 103 is subjected to etching, and its cross-sectional shape 104 became the water droplet form reflecting the concentration distribution within the YIG layer 101 of Be ions.

The cross-sectional dimensions of the etching shape were 0.6 $\mu$m of depth and 0.5 $\mu$m of the maximum width. Similarly, when one line scanning was performed with $Si^{2+}$ ion beam of an acceleration voltage of 120 keV at an injection amount of $5 \times 10^2$ ions/cm$^2$, and etching was effected, the cross-sectional dimensions if the etching shape of an example were found to be 0.2 $\mu$m of depth and 0.2 $\mu$m of the maximum width.

Figure 3:
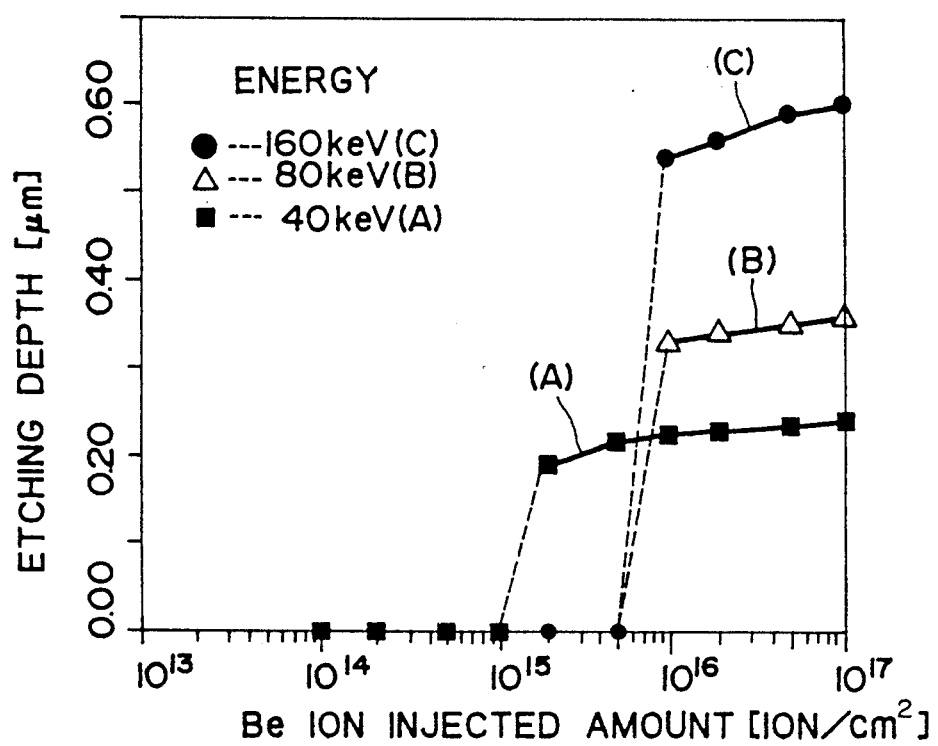
FIG. 3 and FIG. 5 are illustrations showing respectively the etching depths when the ion injecting conditions are varied

FIG. 3 show a plot of Be ion injected amount as the abscissa versus etching depth as the ordinate. This drawing shows the change in etching depth when ion injection was effected by varying the amount of Be ions injected and the acceleration energy of ions. Here, etching was conducted under the same etching conditions as employed for obtaining FIG. 1, and etching depth was measured by use of a pointer type surface roughness meter. In FIG. 3, line (A), line (B) and line (C) show ion injections when the acceleration energy is 40 keV, 80 keV and 16 keV, respectively.

In line (A), etching occurs at a Be injected amount of $2 \times 10^{15}$ ions/cm$^2$ or more, and here the amount of Be injected amount $2 \times 10^{15}$ ions/cm$^2$ is the threshold for causing etching to occur. In line (B), etching occurs at a Be injected amount of $1 \times 10^{16}$ ions/cm$^2$ or more, and here this value is the threshold. Further, in line (C), $1 \times 10^{16}$ ions/cm$^2$ is also the threshold.

In the range of the ion injected from about $1 \times 10^{15}$ to about $6 \times 10^{15}$ ions/cm$^2$, as compared with line (B), line (C) when ion injection is effected at acceleration voltages of 80 keV and 160 keV, the etching depth of line (A) when ion injection is effected at a lower acceleration voltage of 40 keV is deeper.

The reason is explained by use of FIGS. 4A-4D.

Figure 4A:
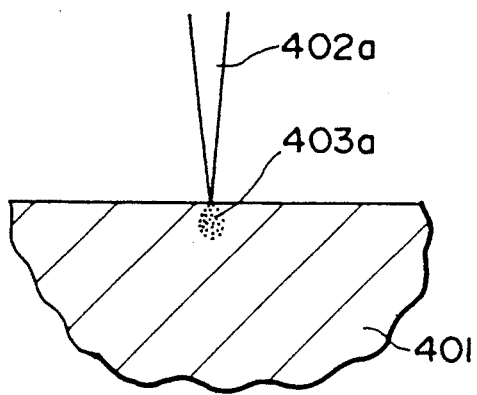
FIGS. 4A–4D are schematic sectional views of the crystal obtained when etching treatment is applied after the acceleration energy of injected ions is varied.
Figure 4B:
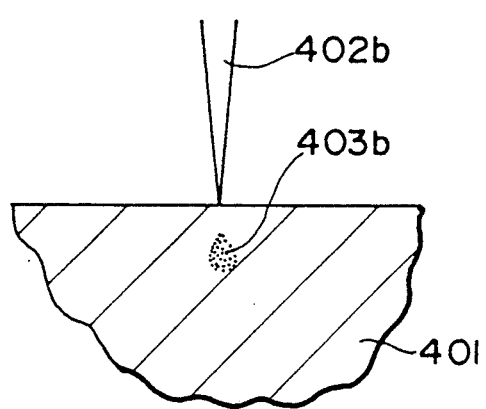

FIGS. 4A and 4B show the injection states when Be ions are injected at an injected amount of $2 \times 10^{15}$ ions/cm$^2$. FIG. 4A shows the case of acceleration voltage of 40 keV and FIG. 4 (B) the case of acceleration voltage of 160 keV, respectively.

Figure 4C:
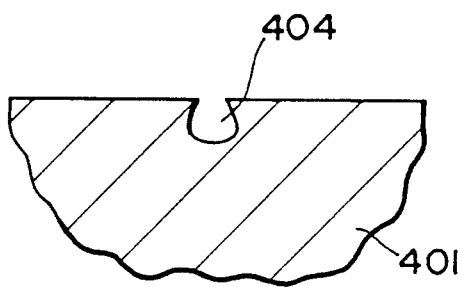
Figure 4D:
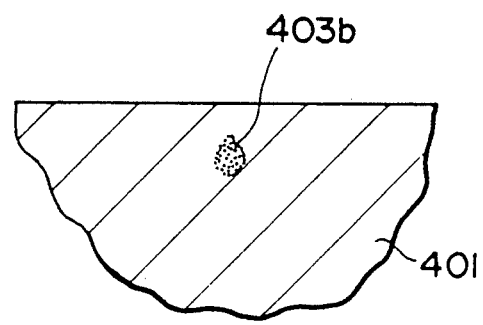

In FIG. 4A, the ion beam 402a accelerated at 40 keV is low in acceleration energy. For this reason, the ion injected portion 403a is formed in the vicinity of the surface of the YIG layer 401. In contrast, in FIG. 4B, the ion beam 402b accelerated at 160 keV is high in acceleration energy. For this reason, the ion injected portion 403b is formed internally of the YIG layer 401. And, when etching is effected, the crystalline structure of the YIG layer 401 surface is destroyed and the ion injected portion 403a converted to amorphous structure is removed. Accordingly, the etching groove 404 shown in FIG. 4C is formed. In contrast the ion injected portion 403b injected with ions at high acceleration energy is formed internally of the YIG layer 401. For this reason, it remains as the ion injected portion 403b shown in FIG. 4 D without being removed. By referring here again to FIG. 3, if the ion injected amount exceeds $6 \times 10^{15}$ ions/cm$^2$, then the etching depth of the line (C) where ion injection is effected at the acceleration voltage energy of 160 keV becomes deeper than the line (A) when ion injection is effected at the acceleration voltage of 40 keV. This is because the 160 keV ion injected portion 403b has become more dense by increase of ion injected amount, whereby said injected portion 403b is expanded to the surface of the YIG layer 401

Figure 5:
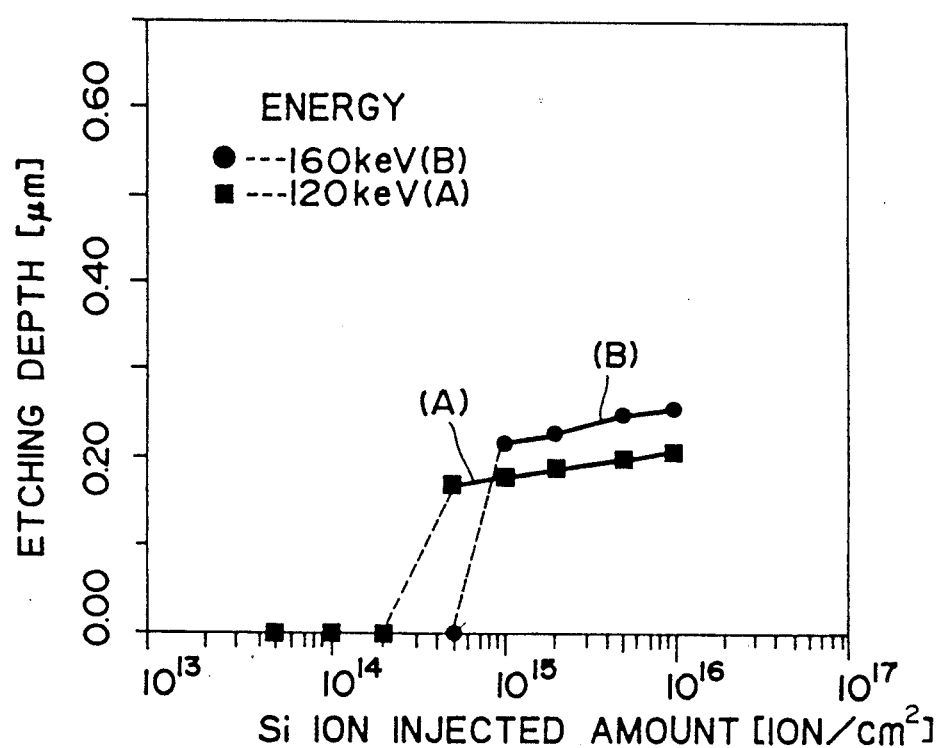

Next, FIG. 5 is to be explained. FIG. 5 is obtained by replacing Be ions in FIG. 3 with Si ions, with Si ion injected amount being plotted on the abscissa versus etching depth on ordinate. Here, line (A) and line (B) show respectively the cases when ion injection is effected at acceleration voltages of 120 keV and 160 keV. Also, in this Figure, it is shown that threshold exists for whether etching is possible or not. And, similarly as in FIG. 3 the etching depth is reversed (line (A), line (b)) according to the difference in acceleration energy depending on the ion injected amount. This is because of the same reason as explained for FIG. 3.

Figure 6A:
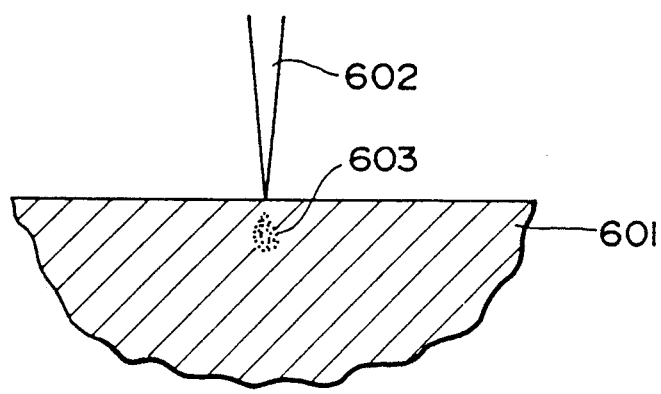
FIGS. 6A and 6B are schematic sectional views of an example when a tunnel-shaped etching groove is formed.
Figure 6B:
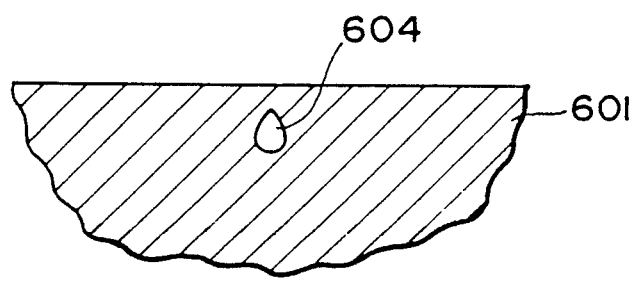
Figure 7:
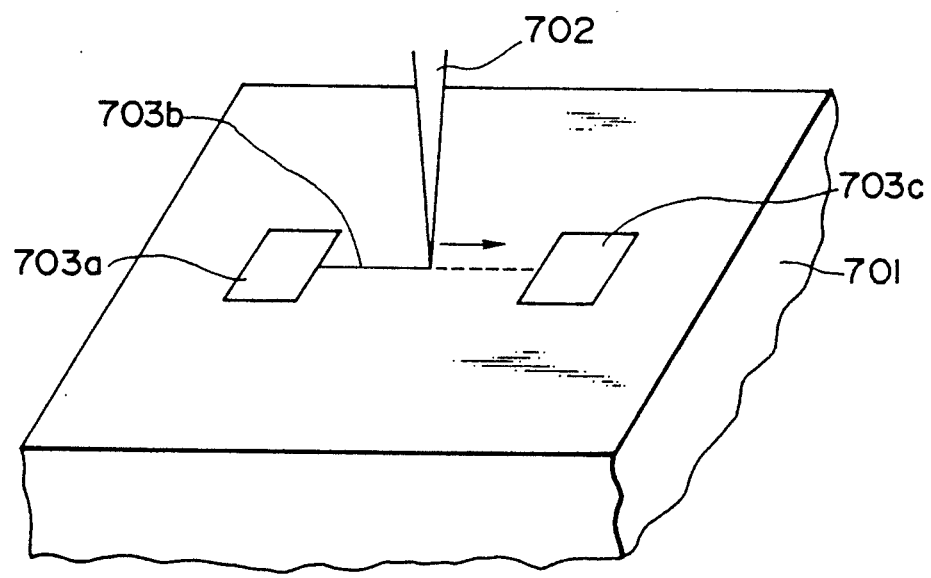
FIG. 7 is a perspective view thereof.

FIGS. 6A and 6B are schematic illustrations of the steps (sectional views) when applying working of a hollow shape in a crystalline material. The steps are shown below. First, as shown in FIG. 3 and FIG. 5, an ion beam 602 is irradiated in YIG layer 601 under appropriate ion injecting conditions at a value lower than the threshold where etching occurs to form an ion injected portion 603. Then, etching treatment is performed by use of phosphoric acid. In this way, a hollow etching region 604 is obtained. In this case, an inlet for etchant to permit the etchant to reach the ion injecting portion 603 is required. This is to be explained by use of FIG. 7.

At the region 703b where a hollow etching region is desired to be formed, an ion beam 702 is irradiated. And, for example, at both ends of said region 703b, injection inlets 703a, 703c for etchant are formed. Said injection inlets 703a and 703c are formed by removing the crystalline surface by etching. Accordingly, prior to performing etching, ion injection is effected at the regions where injection inlets 703a and 703c are to be formed under the ion injecting conditions of the threshold where etching occurs as shown in FIG. 3 and FIG. 5. The ion injecting conditions of the threshold or higher are to effect ion injection at an ion injected amount the ion injected amount in the region 703b, for example at an injected amount of $5 \times 10$ ions/cm$^2$. Subsequently, by dipping the YIG layer 701 after ion injection into an etchant, the region injected with ions under the ion injecting conditions of the threshold or higher is removed to form the injection inlets 703a and 703c for the etchant. Then, by further continuing the etching treatment, the etchant injected through the injection inlets 703a, 703c reaches the region 703b, whereby the region 703b is removed to form a hollow etching region 604.

Here, the etchants used for formation of the injection inlets 703a and 703c for the etchant may be either the same or different in kind.

When hollow etching working is applied as shown in FIG. 6, ion species of light mass such as Be, He, etc. may be preferably used. This is because ions with greater mass have strong power to destroy crystalline structure, thus tending to destroy also the crystalline structure on the surface side of the crystal surfaces.

Here, the concentration distribution of the ions injected into the target which is the material to be treated in the depth direction generally indicates a Gaussian distribution in the depth direction within the target. In this way, a region where the ion concentration becomes the maximum is formed internally in the target rather than on the target surface.

Also, as can be seen from comparison between FIG. 3 and FIG. 5, the etching depth depends on the ion species (inversely proportional to mass of ions). Further, the etching depth is proportional to the acceleration energy of ions and the injected amount of ions.

Next, another example of the present invention is shown.

Figure 8A:
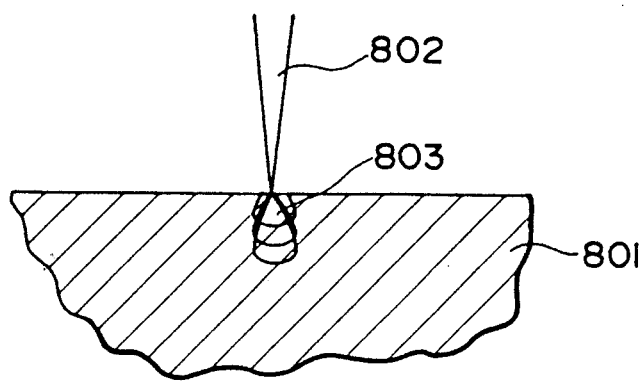
FIGS. 8A and 8B are schematic sectional views showing an example when etching treatment is performed by effecting ion injection overlappingly.
Figure 8B:
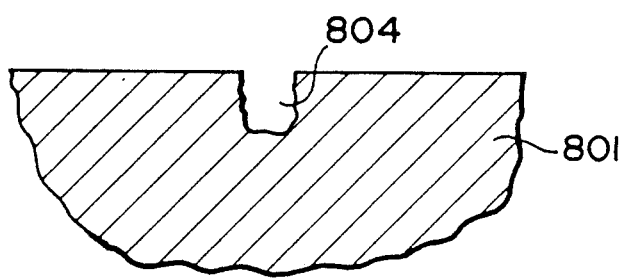

FIGS. 8A and 8B show examples wherein the present invention is practiced as one approach for obtaining a rectangular etching cross-section. On the YIG layer 801, focused ion beams 802 of 160 keV Be$^{2+}$, 80 keV Be$^{2+}$ and 40 keV Be$^{2+}$ were scanned at one line on the same position respectively at the injected amounts of $2 \times 10^{16}$, $1 \times 10^{18}$ and $5 \times 10^{15}$ ions/cm$^2$, followed by chemical etching by use of phosphoric acid to form a rectangular groove 804. Thus, by effecting chemical etching after injecting ions with different acceleration voltages on the same position or overlappingly on different positions, any desired three-dimensional etching shape can be obtained.

As described above, even when a crystalline material may be exposed to an etchant, by performing the fine working of a crystalline material having the ion injecting step of effecting ion injection under the ion injecting conditions where a predetermined region of the ion injection region in the crystalline material is not removed, and the step of removing the predetermined region of said ion injection region by injecting an etchant into the ion injection region formed by ion injection under the above ion injecting conditions, a crystalline material can be worked to a complicated shape having a cross-sectional shape of a reverse tapered shape or hollow region which has been worked with difficulty in the prior art. Also, by applying the etching treatment overlappingly on the region injected with ions, any desired three-dimensional structure can be formed. As the result, an excellent electronic device, micromechanics device or a quantum effect device having ultra-fine structure can be provided.

What is claimed is:

1. A method of fine working crystalline material, which includes forming an ion injection region in a crystalline material by irradiating a focused ion beam on a predetermined first surface region (A) of said crystalline material and subsequently removing crystalline material beneath said predetermined surface region of said ion injection region by applying a chemical etching treatment, the improvement which comprises the steps of:

performing ion injection under first ion injecting conditions where no removal of said first predetermined surface region (A) occurs even if said first surface region (A) is exposed to an etchant;

forming an injection inlet for said etchant in said crystalline material located at a second surface region adjacent to said first surface region (A);

introducing said etchant from said inlet onto said crystalline material;

causing said etchant to make contact with a high ion concentration region of said ion injected region formed by ion injection under said first ion injection conditions; and removing said high ion concentration region without removing said first surface region (A) thereby forming a hollow shape in the crystalline material.

2. A fine working method of a crystalline material according to claim 1, wherein said ion injecting conditions are defined by performing at least one of control of the acceleration voltage of said injection ions, control of the amount of injected ions and selection of injected ion species.

3. The fine working method according to claim 1, wherein said injection inlet of the etchant is formed by injecting under second ion injection conditions an increased amount of ions as compared to said first ion injection conditions, and applying chemical etching treatment.

4. The fine working method according to claim 7, wherein the etchant used in removing the high ion concentration region and the etchant used for forming the injection inlet form the etchant are the same.

* * * * *

UNITED STATES PATENT AND TRADEMARK OFFICE
CERTIFICATE OF CORRECTION

PATENT NO. : 4,999,083

DATED : March 12, 1991

INVENTOR(S) : NOBUO WATANABE, ET AL

It is certified that error appears in the above-identified patent and that said Letters Patent is hereby corrected as shown below:

On the title page, Item [56] REFERENCE CITED:

IN [56] REFERENCES CITED

FOREIGN PATENT DOCUMENTS, "238468  6/1985" should read --238468  8/1986--.

COLUMN 1

Line 56, "also" should be deleted.

COLUMN 2

Line 17, "regions" should read --region--.
Line 32, "invention" should read --invention;--.
Line 35, "varied" should read --varied;--.
Line 49, "Preferable of" should read --Preferred for--.
Line 59, "regions" should read --region--.
Line 60, "expose" should read --exposed--.
Line 67, "injeCtion" should read --injection--.

COLUMN 3

Line 32, "quentum" should read --quantum--.
Line 44, "EB" should read --ExB--.
Line 60, "beam.  Preferably" should read --beam, preferably--.
Line 64, "yttruim-" should read --yttrium- --.

COLUMN 4

Line 10, "gadlinium gallium-garnet" should read --gadolinium-gallium-garnet--.

UNITED STATES PATENT AND TRADEMARK OFFICE
CERTIFICATE OF CORRECTION

PATENT NO. : 4,999,083

DATED : March 12, 1991

INVENTOR(S) : NOBUO WATANABE, ET AL

It is certified that error appears in the above-identified patent and that said Letters Patent is hereby corrected as shown below:

COLUMN 4

Line 20, "example 85%" should read --example, 85%--.
    Line 28, "amorphous non-injected" should read --amorphous and the non-injected--.
    Line 30, "a" should read --an--.
    Line 47, "if" should read --of--.
    Line 49, "show" should read --shows--.
    Line 59, "16 keV." should read --160 keV,--.
    Line 67, "the ion" should read --the amount of ion--.

COLUMN 5

Line 22, "contrast the" should read --contrast, the--.
    Line 45, "FIG. 3 the" should read --FIG. 3, the-- and "(line (A), line (b))" should read --(line (A), line (B))--.

COLUMN 6

Line 7, "10" should read --$10^{16}$--.
    Line 14, "inlets 703a" should read --inlets 703a--.
    Line 46, "10" should read --10-- (both occurrences).

COLUMN 7

Line 5, "crystalline" should read --a crystalline--.

UNITED STATES PATENT AND TRADEMARK OFFICE
CERTIFICATE OF CORRECTION

PATENT NO. : 4,999,083

DATED : March 12, 1991

INVENTOR(S) : NOBUO WATANABE, ET AL

It is certified that error appears in the above-identified patent and that said Letters Patent is hereby corrected as shown below:

COLUMN 8

Line 20, "claim 7," should read --claim 3,--.
      Line 23, "form" should read --for--.

Signed and Sealed this

Twentieth Day of April, 1993

Attest:

MICHAEL K. KIRK

*Attesting Officer*      *Acting Commissioner of Patents and Trademarks*